United States Patent
Nah et al.

(10) Patent No.: US 11,110,534 B2
(45) Date of Patent: Sep. 7, 2021

(54) CONTINUOUS SOLDER TRANSFER TO SUBSTRATES

(71) Applicant: INTERNATIONAL BUSINESS MACHINES CORPORATION, Armonk, NY (US)

(72) Inventors: Jae-Woong Nah, Closter, NJ (US); Stephen L. Buchwalter, Anthem, AZ (US); Peter A. Gruber, Mohegan Lake, NY (US); Da-Yuan Shih, Poughkeepsie, NY (US); Paul Alfred Lauro, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 331 days.

(21) Appl. No.: 16/378,547

(22) Filed: Apr. 8, 2019

(65) Prior Publication Data

US 2020/0316702 A1 Oct. 8, 2020

(51) Int. Cl.
*B23K 1/00* (2006.01)
*B23K 3/06* (2006.01)
(Continued)

(52) U.S. Cl.
CPC .......... *B23K 3/0607* (2013.01); *B23K 3/0638* (2013.01); *B23K 3/08* (2013.01); *H01L 24/26* (2013.01)

(58) Field of Classification Search
CPC ...... B23K 3/0607; B23K 3/08; B23K 3/0638; B23K 1/0016; H01L 24/26; H01L 2224/05655; H01L 2224/05647; H01L 2224/05639; H01L 2224/131; H01L 2224/05644; H01L 2224/05669; H01L 2224/05624; H01L 2224/05664; H01L 24/13; H01L 24/11; H01L 2224/11849; H01L 2224/13022; H01L 2224/1111; H01L 2224/05567; H01L 2224/0401; H01L 2224/117; H01L 2224/1132; H01L 24/742;
(Continued)

(56) References Cited

U.S. PATENT DOCUMENTS 3,886,650 A * 6/1975 Cobaugh ............ H01R 43/0235
228/136
5,397,049 A 3/1995 Gileta et al.
(Continued)

FOREIGN PATENT DOCUMENTS

DE 19524076 C1 * 10/1996 ........... B29C 59/025
JP 01005039 A * 1/1989
(Continued)

*Primary Examiner* — Kiley S Stoner
(74) *Attorney, Agent, or Firm* — Daniel P. Morris; Lou Percello, Attorney, PLLC

(57) ABSTRACT

In an Injection Molded Soldering system, a single, one-layer decal has one or more through hole patterns where each through hole pattern has a plurality of through holes through the decal. A drum with a drum circumference turns while the decal is forced to be adjacent to the drum circumference. The decal passes by a tangent point on the drum circumference where one or more solder-filled through hole patterns align with recessed openings on a substrate at the tangent point of the drum circumference. Applied heat causes the solder structures to melt and flow into the recessed openings.

20 Claims, 10 Drawing Sheets

(51) Int. Cl.
*H01L 23/00* (2006.01)
*B23K 3/08* (2006.01)

(58) Field of Classification Search
CPC ... H05K 3/0097; H05K 3/1233; H05K 3/3468
USPC .................................. 228/180.22, 245–262
See application file for complete search history.

(56) References Cited

U.S. PATENT DOCUMENTS

| | | | |
|---|---|---|---|
| 5,673,846 A | 10/1997 | Gruber | |
| 6,294,407 B1 | 9/2001 | Jacobs | |
| 7,845,539 B1 | 12/2010 | Kim et al. | |
| 8,408,448 B1 * | 4/2013 | Feger | B23K 3/0623 |
| | | | 228/215 |
| 8,523,046 B1 * | 9/2013 | Gruber | B23K 3/0623 |
| | | | 228/246 |
| 8,561,880 B2 * | 10/2013 | Gruber | B22D 25/02 |
| | | | 228/256 |
| 9,502,367 B2 | 11/2016 | Onozuka et al. | |
| 2005/0150402 A1 * | 7/2005 | Kambara | H01L 21/56 |
| | | | 101/123 |
| 2008/0176393 A1 * | 7/2008 | Mackay | H01L 21/44 |
| | | | 438/613 |
| 2009/0093111 A1 * | 4/2009 | Buchwalter | H01L 24/742 |
| | | | 438/614 |
| 2010/0025863 A1 * | 2/2010 | Gruber | H01L 23/49816 |
| | | | 257/778 |
| 2010/0116871 A1 * | 5/2010 | Gruber | B23K 3/0638 |
| | | | 228/244 |
| 2011/0127312 A1 | 6/2011 | Gruber et al. | |
| 2011/0237030 A1 * | 9/2011 | Gruber | H01L 24/743 |
| | | | 438/111 |
| 2011/0272450 A1 | 11/2011 | Gruber et al. | |
| 2012/0318855 A1 * | 12/2012 | McLeod | B23K 1/20 |
| | | | 228/203 |
| 2013/0330880 A1 * | 12/2013 | Dang | H01L 24/97 |
| | | | 438/113 |
| 2014/0035150 A1 * | 2/2014 | Gruber | B23K 26/40 |
| | | | 257/772 |
| 2014/0065771 A1 * | 3/2014 | Gruber | H01L 24/81 |
| | | | 438/121 |
| 2014/0069817 A1 * | 3/2014 | Dang | H01L 24/11 |
| | | | 205/122 |
| 2014/0262113 A1 * | 9/2014 | Feger | B23K 35/0222 |
| | | | 164/158 |
| 2021/0125950 A1 * | 4/2021 | Hisada | H01L 24/11 |

FOREIGN PATENT DOCUMENTS

| | | | | |
|---|---|---|---|---|
| JP | 08090217 A | * | 4/1996 | |
| JP | 2000286543 A | * | 10/2000 | |
| JP | 2001225443 A | * | 8/2001 | ........ H05K 3/1233 |
| KR | 20100100150 A | * | 9/2010 | |
| KR | 101881105 B1 | * | 7/2018 | |

* cited by examiner

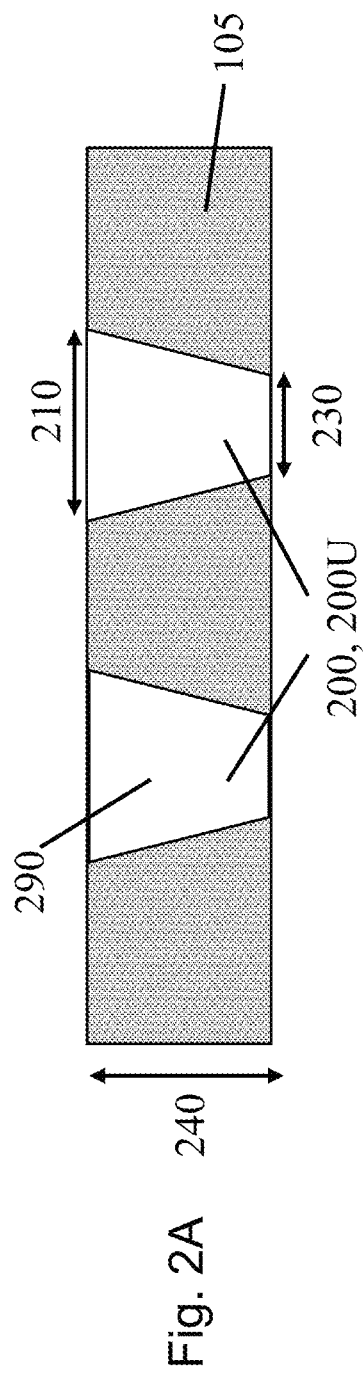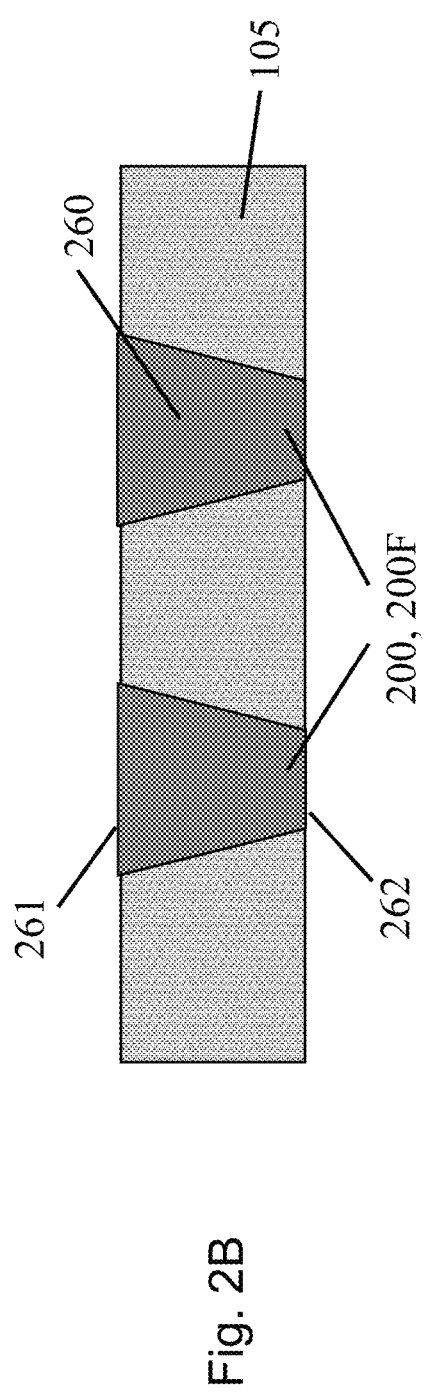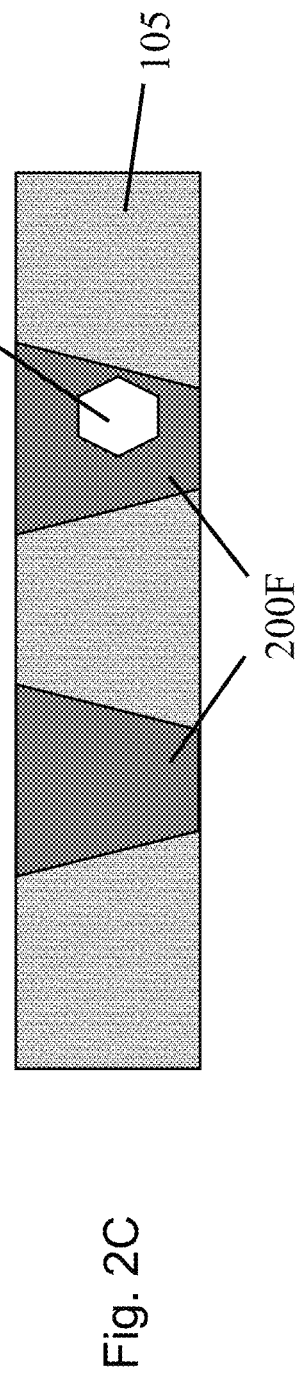

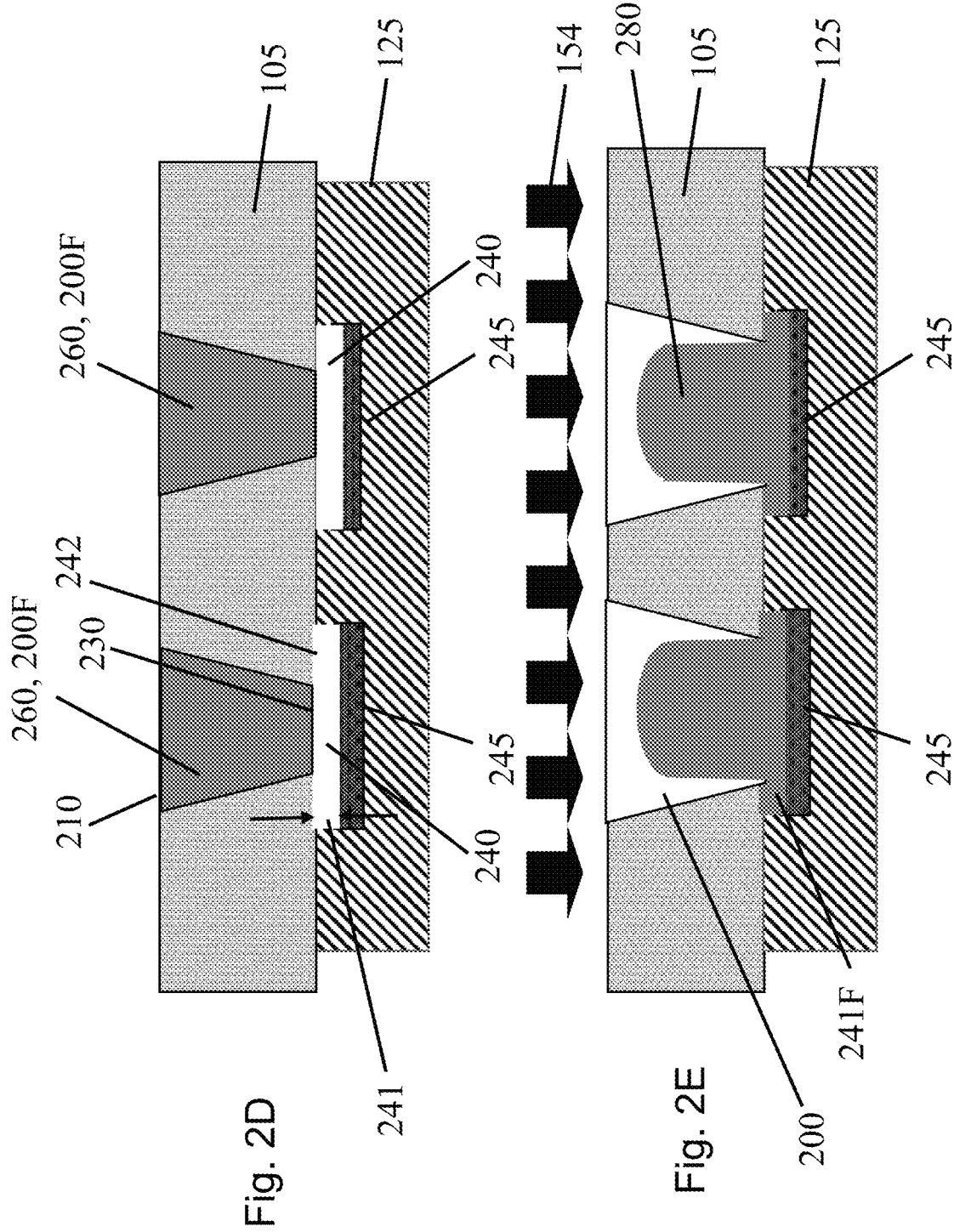

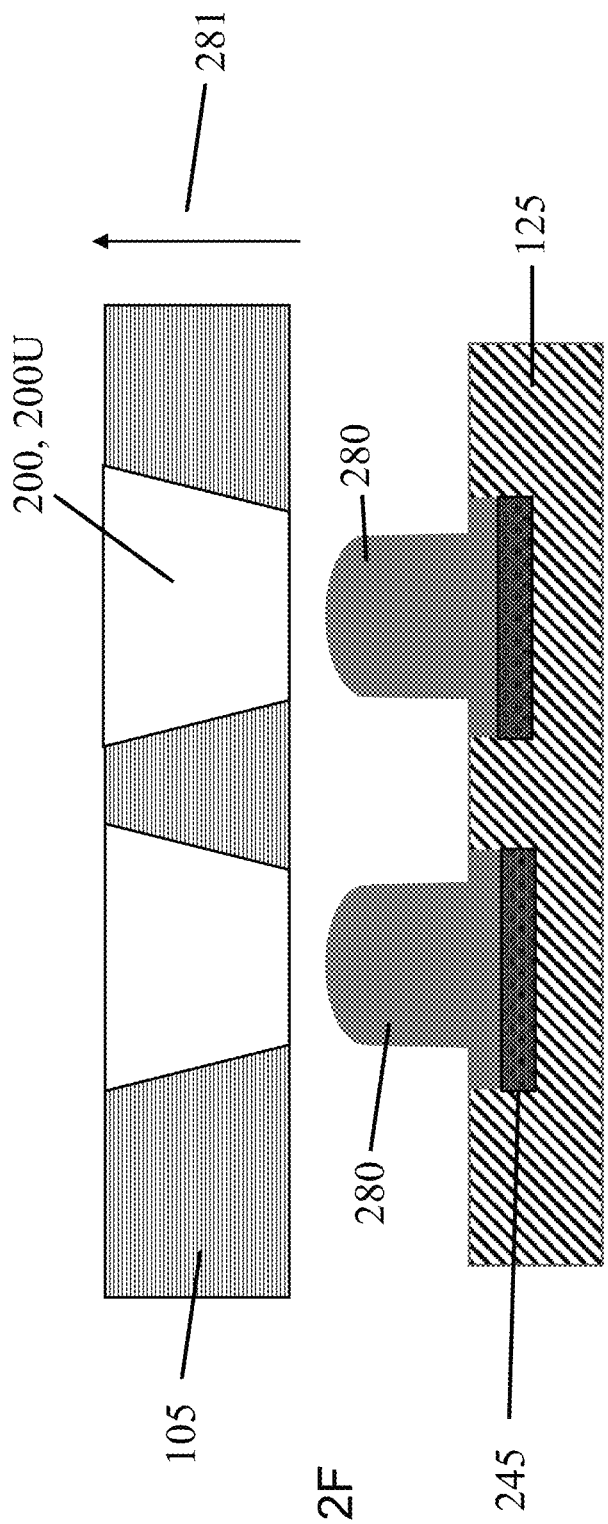
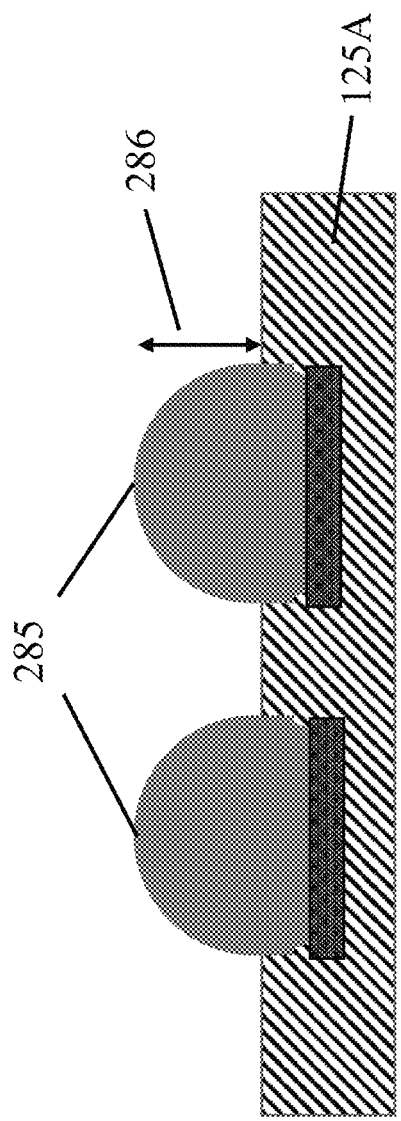
Fig. 2F
Fig. 2G

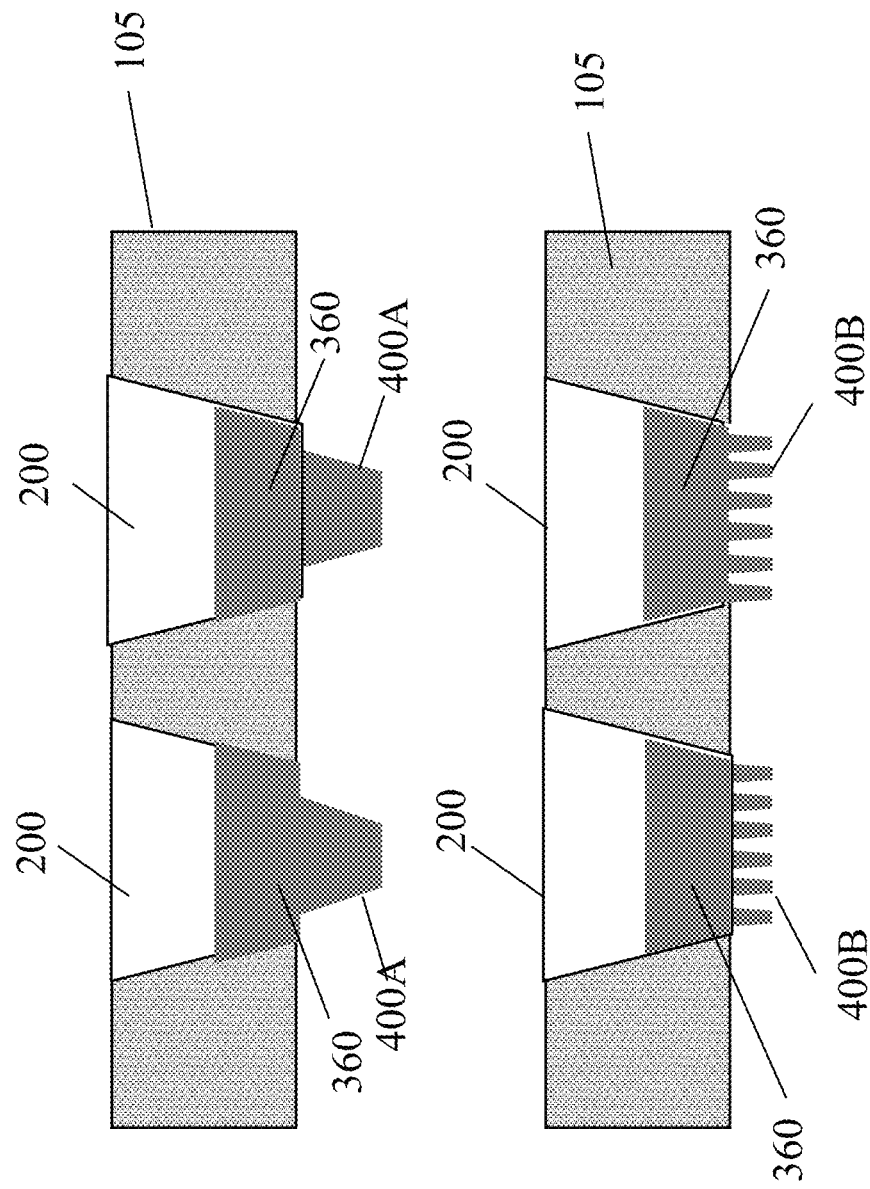

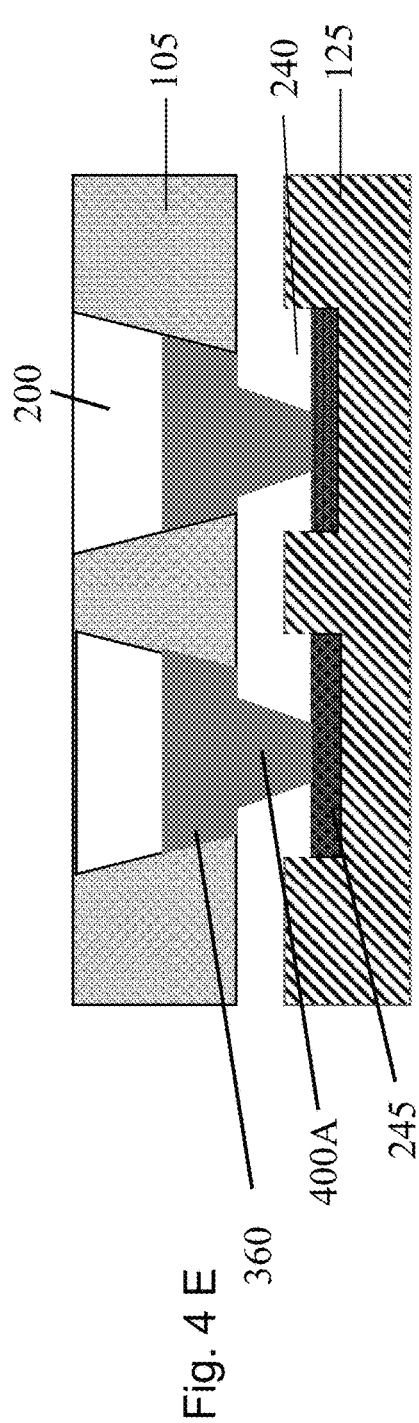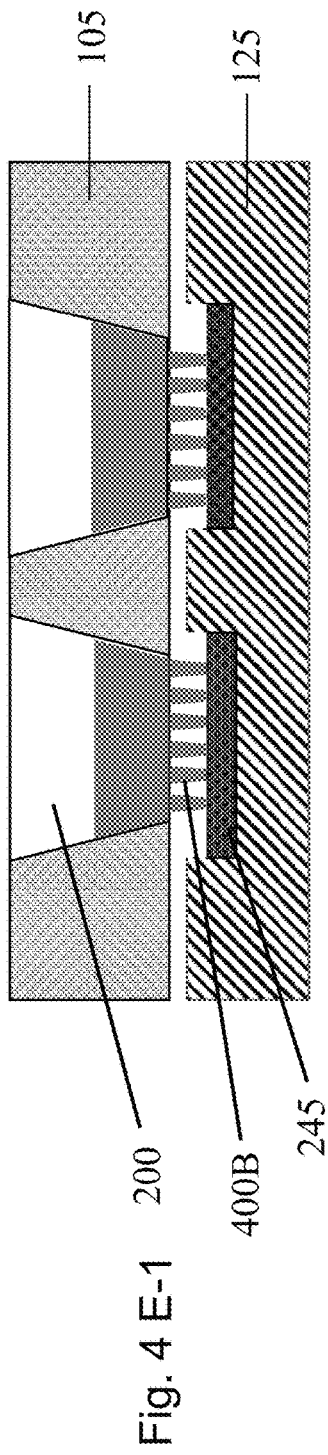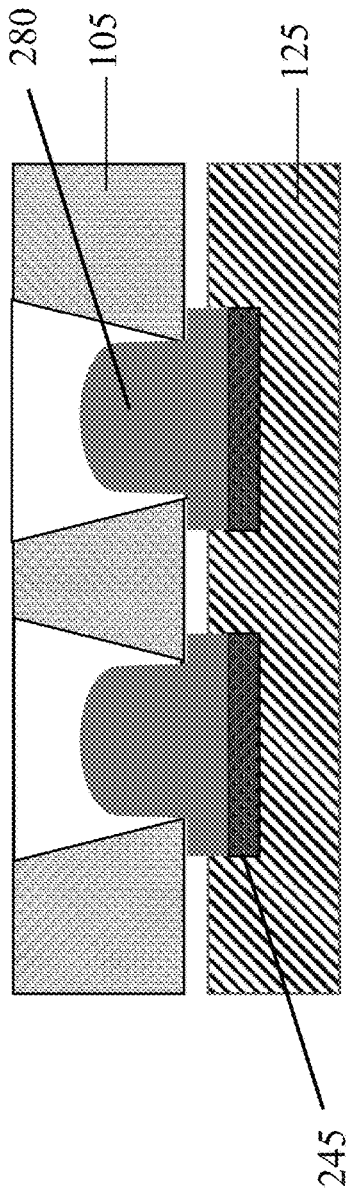
Fig. 4 E
Fig. 4 E-1
Fig. 4 F

CONTINUOUS SOLDER TRANSFER TO SUBSTRATES

BACKGROUND

This invention is related to apparatus, methods of manufacture, and devices for solderable connections with a fine pitch. More specifically, the invention relates to soldering of semiconductor devices and substrates and to an improved solder decal, apparatus, and method of using these components and methods of making solder connections with a fine pitch on semiconductor devices.

Solder processing for standard electronic packaging applications such as integrated circuit chip interconnections routinely use evaporation or electroplating. However, both processes are costly and may involve many processing steps including photolithography. For example, to produce a solder by electroplating, a metal seed layer must first be deposited on a substrate followed by patterning photoresist. Next, this seed layer is patterned to produce the desired layout, after which the plating process produces the solder structures. Finally, the patterning and unplated seed layers must be stripped away. The seed layer remaining under each solder structure must not metallurgically bond to the solder during reflow. These processes are typically limited to smaller solder structures such as solder balls having a diameter of about 2 to 4 mils.

Solder decals can be produced wherein a decal strip having a plurality of anchor holes is aligned with a mold having a plurality of cells. Liquid solder is injected into the anchor holes and mold cells and is then allowed to cool to solidify therein. The mold may be separated from the decal strip to form the solder decal containing solder beads each having a stem mechanically joined to the strip at respective ones of the anchor holes. Various forms of the solder decal are used for transferring the solder beads to a substrate or chip or effecting temporary connections for conducting burn-in and testing or accommodating thermal mismatch for example.

The existing Injection Molded Soldering (IMS) techniques using two layers of decals requires precise alignment processes between the decals. The alignment should have stability at high temperature during IMS. However, as the dimensions of the solder connections become smaller, and has a finer pitch, alignment in these IMS techniques becomes more difficult.

There is a need for improved alignment techniques for manufacturable pre-soldering method on organic substrates with fine pitch I/Os.

SUMMARY OF THE INVENTION

Preferred embodiments of systems, methods, and devices for injecting molded solder onto substrates is disclosed. In preferred embodiments the invention has a single, one-layer decal with one or more through hole patterns where each through hole pattern has a plurality of through holes through the decal. In a preferred embodiment, the through holes have a through hole top with a top width and a through hole bottom with a bottom width with the top width being wider than the bottom width so a solder structure can be held in the through hole while the decal is driven in a decal direction. A substrate belt holds a plurality of substrates and is driven in a belt direction. A fill head injects the through holes with solder as the through hole pattern is driven past the fill head causing a solder structure to form within each of one or more of the through holes. A drum with a drum circumference turns while the decal is forced to be adjacent to the drum circumference. The decal passes by a tangent point on the drum circumference where one or more of the solder-filled through holes align with respective recessed openings on a substrate at the tangent point. Applied heat causes the solder structures to melt and flow into the recessed opening.

BRIEF DESCRIPTION OF THE DRAWINGS

FIG. 2A shows a cross section of a single, one-layer decal with through hole openings.

FIG. 2B shows a cross section of a single, one-layer decal with through hole openings filled with solder structures.

FIG. 2C shows an inspection of a single, one-layer decal with through hole openings filled with solder structures with a defect.

FIG. 2D shows a cross section of a single, one-layer decal with through hole openings filled with solder structures with the solder structures aligned over one or more recessed pads on a substrate.

FIG. 2E shows the solder structures filling the through hole openings being forced under gas pressure on to recessed pads on a substrate while heat is applied to reflow the solder.

FIG. 2F shows removal of the single, one-layer decal.

FIG. 2G shows the solder ball contacts on the substrate after another reflow.

FIG. 4C-1 shows using a protrusion fill head applying heat and gas pressure to create alternative protrusion solder structures with alternative protrusions protruding from the through holes in the single, one-layer decal.

FIG. 4D-1 shows the in-decal protrusion solder structures with an alternative preferred shaped protrusion.

FIG. 4E-1 shows a cross section of a single, one-layer decal with through hole openings filled with protrusion solder structures with an alternative preferred shape protruding from the through holes with the protrusion aligned over one or more recessed pads on a substrate.

DETAILED DESCRIPTION

Figure 1:
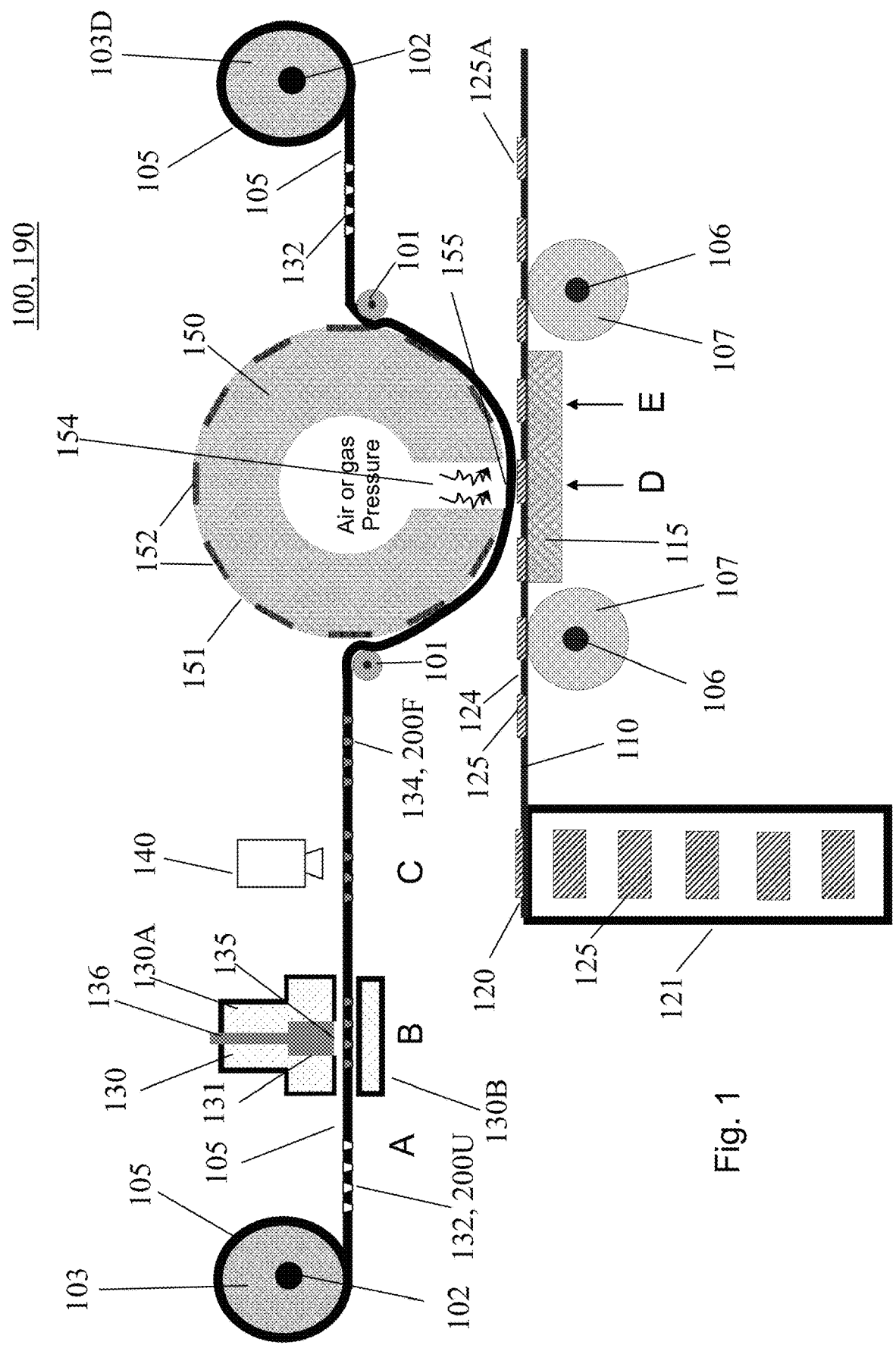
FIG. 1 shows an Injection Molded Solder (IMS) apparatus and a process using a single, one-layer decal and a gas pressure stage to transfer solder structures with a fine pitch onto substrates.

Exemplary embodiments of the invention will now be discussed in further detail regarding devices, structures, and methods of manufacturing as aspects of the present invention.

Illustrative embodiments of the invention may be described herein in the context of illustrative methods, along with illustrative apparatus, systems and devices formed using such methods. However, it is to be understood that embodiments of the invention are not limited to these illustrative methods, apparatus, systems and devices but instead are more broadly applicable to other alternative and broader methods, apparatus, systems and devices that become evident to those skilled in the art given this disclosure.

It is to be understood that the various regions shown in the accompanying drawings are not drawn to scale, and that one or more regions of a type commonly used may not be explicitly shown in a given drawing. This does not imply that the regions not explicitly shown are omitted from the actual devices.

In addition, certain elements may be left out of certain views for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices, structures, and methods for forming these devices and structures in accordance with embodiments of the present invention can be employed in applications, semiconductor manufacturing and use, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, etc. Systems and hardware incorporating the devices and methods are contemplated embodiments of the invention.

As used herein, "height" refers to a vertical size of an element (e.g., a layer, trench, hole, opening, solder structure/ball, etc.) in the cross-sectional or elevation views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional or elevation views measured from a top surface to a bottom surface of the element. Terms such as "thick", "thickness", "thin" or derivatives thereof may be used in place of "height" where indicated.

As used herein, "lateral," "lateral side," and "lateral surface" refer to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

This invention is related to a manufacturable soldering method on organic and other substrates with fine pitch I/Os. In preferred embodiments, the invention creates one or more protruded solder structures in through holes in a single, one-layer decal. In preferred embodiments, air (or gas) pressure or other means force the solder structures (or protrusions of the solder structure) to make contact with metal pads on a substrate. For example, a solder mask layer is formed on top of an organic substrate placing solder structures in the solder mask layer over metal pads on the organic substrate that are recessed around 15 to 25 microns below the solder mask layer. The invention eliminates the alignment process between two layer decals and provides an improve alignment process.

Prior methods need an alignment process between two solder decals before Injection Molded Solder (IMS) and the alignment between the two decals should have stability at high temperature during IMS. Therefore, it is advantage to provide a method for forming solder bumps on recessed pads by using one decal layer instead of two decal layers.

FIG. 1 shows an Injection Molded Solder (IMS) apparatus 100 and a process 190 using a single, one-layer decal 105 and a gas pressure stage, "D," to transfer solder structures 134, 200F with a fine pitch onto substrates 125.

The apparatus 100 comprises decal reels (103, 103D) rotating about a reel axis 102 that pulls a single, one-layer decal 105 (or decal 105) through the apparatus 100. For example, decal reel 103D is a drive reel 103D rotating so that the decal 105 is pulled through the apparatus as the decal unrolls from decal reel 103.

The decal 105 is a flexible "ribbon-like" material that has a series of through hole patterns 132 passing through the decal 105. The decal 105 through hole patterns 132 can be created by mechanical punches, laser penetration, or chemical etching methods. The decal 105 can be made from polyamide, rubber, Teflon™, metal foil, etc.

After the decal 105 unrolls from the decal reel 103, the decal 105 passes through various steps in the process 190. In step A, the decal 105 unrolls from reel 103 exposing one or more unfilled through hole patterns 132. In step B, through hole patterns 132 pass through a decal fill head 130 where each of the through holes in the through hole pattern 132 is filled with solder 131. In step C, each of the through holes in each of the filled through hole patterns 134 is inspected to insure each through hole is properly filled with solder 131. In a preferred embodiment, the decal 105 moves in a decal direction from the decal reel 103 to the drive reel 103D. In a preferred embodiment, process 190 is performed in a Nitrogen environment.

The decal 105 with filled through hole patterns 134 are pulled around the circumference of a drum 150. At least 2 drum rollers 101 hold the decal 105 tightly to the surface of the circumference of the drum 150 as the decal 105 is pulled around the drum 150 circumference.

A substrate belt 110 holds a plurality of substrates 125. Each substrate 125 is spaced at a substrate distance 124 from the next substrate 125 on the substrate belt 110. Two or more substrate belt rollers 107 each rotate on substrate belt roller 107 axis 106 to move the substrate belt 110 and the attached substrates 125 to a tangent point 155 to the drum 150. One or more substrates 125 at a time will be in physical contact with the decal 105 at the tangent point 155 of the drum 150. In preferred embodiments, a substrate pressure plate 115 pushes on the substrate belt 110 to force and maintain contact of one or more substrates 125 at a time to the decal 105 at the tangent point 155. In a preferred embodiment, the belt 110 moves in a belt direction parallel to the decal direction.

In preferred embodiments, the substrate 125 can be a semiconductor chip package, a printed circuit board (e.g. an organic printed circuit board), glass, doped semiconductor, etc.

In a preferred embodiment, the drum 150 has one or more drum openings 152 around the circumference of the drum 150. Each of the drum openings 152 is separated from the next drum opening by circumferential distance 151.

In a preferred embodiment, in step D, there is an alignment of the angular position of the drum 150, the filled through hole patterns 134, and the substrate position of a substrate 125 on the substrate belt 110 so that a drum opening 152, a filled through hole pattern 134, and a substrate 125 are in vertical alignment at the tangent point 155 at the same time, step D. In a preferred embodiment, filled holes 200F in the through hole pattern 134 also align with respective recessed openings 240 (described below) on the surface of the substrate 125. At this time, a gas, e.g. in a preferred embodiment air, is forced from the interior of the drum 150 through the aligned drum opening 152, and into the filled through holes 200F in the aligned through hole pattern 134. This gas pressure in conjunction with the force pushing the aligned substrate 125 into the decal 105 and drum 150 forces the solder structures 260 in the recessed openings 240 in the aligned substrate 125 as described in more detail below. At step E the result is a substrate 125A with solder contacts, e.g. solder balls, physically, structurally, and electrically attached to the substrate 125A. The aligned filled hole pattern 134, now emptied of solder 132, rolls onto the drive reel 103D. See below for a more detail description.

In a preferred embodiment, the substrate distance 124 and the circumferential distance 151 are equal. The width of the drum opening 152 and the length of the through hole pattern 134 is such that the drum opening 152 exposes the all the filled through holes 200F in the aligned through hole pattern 134 to air pressure when alignment occurs at the tangent point 155 each time in step D occurs. After an initial alignment of the decal 105, drum 150, drum openings 152, and substrates 125 on the substrate belt 110, one substrate 125 after another substrate 125 will appear at tangent point 155 at the same time a drum opening 152 and a filled through hole pattern 134 aligns so that substrate 125 after substrate 125 will have solder bumps attached in a continuous and automated way.

Once the process 190 is completed for all the substrates 125 on a roll 103, the roll 103 with all through holes 200U empty of solder can be reused. For example, the drive roll 103D can be switched with the now empty roll 103 and the process 190 continued.

In one preferred embodiment, the substrates 125 are placed on the substrate belt 100 by a stacker or placement apparatus 121. After the substrates 125 are placed on the substrate belt 100 the inspection device 140 (or other device) can check if one of the through hole patterns 134 is lined up with the pattern of recessed metal pads on one of the substrates 125 on the substrate belt 100. Once the through hole pattern 132 and the recessed metal pads of the substrate 125 are aligned, the alignment will be maintained in the apparatus 100 because the circumferencial distance 151 and substrate distance 124 are equal.

In preferred embodiments, the substrate pressure plate 115 further comprises a heat plate that can apply heat either continuously or intermittently to the aligned substrate 125 to permit attachment and/or reflow of the solder structures from the aligned filled hole pattern 134 to the aligned substrate 125.

Step B of the process 190 uses a solder fill head 130 to perform an Injection Molded Solder (IMS) step. In a preferred embodiment, the solder fill head 130 comprises a casing 130A which contains a solder 131 supply 136 that fills a solder chamber 135. The solder chamber 135 is open on a side under which the decal 105 moves. A solder filling plate 130B pushes the decal 105 against the fill head 130 solder chamber 135 opening so that each through hole in an empty through hole pattern 132 passing under the solder chamber 135 opening is in tight contact with the solder chamber 135 so the through holes fill with solder 131. In preferred embodiments, the solder fill plate 130B contains the solder within the through hole 200F so that no solder protrudes out of the through holes 200F. See a more detailed description below.

In a preferred embodiment, an inspection device 140 inspects the filled through holes 200F in the filled through hole pattern 134 to insure all through holes are completely filled with solder. A monitoring and control system (not shown) takes a signal from the inspection device 140 when there is a filled through hole pattern 134 that has improperly filled holes (a defect), marks the defective filled through hole pattern 134 and identifies the substrate 125 that receives the defective fill, e.g. for removal.

The inspection device 140 can be an X-ray source that produces an X-ray image of the solder structures injected into the through holes 200F with an image processing feature that determines if the through hole 200F was correctly filled with solder 131.

The X-ray source can detect missed holes or partially filled holes and record defected location from these holes. Also, the substrate 125 is located below solder filled decal at 120 while X-ray source is ON. A stage 120 moves in X, Y, and theta directions for making alignment between solder filled holes and pads on a substrate based on the X-ray image.

The information of defect pattern is transferred to air or gas pressure operation, 154. In one embodiment, the air pressure 154 is not operated for defected pattern and solder structures are not transferred to a substrate for defectively filled through hole patterns 132.

FIG. 2A shows a cross section of a single, one-layer decal 105 with a thickness 240 of between 5 microns and 500 microns. The through holes 200 are unfilled through holes 200U because they have not yet gone through the IMS step, step B. An unfilled through hole pattern 132 is a plurality of unfiled through holes 200U that pass through the thickness 240 of the decal 105 in a location that fits under the opening of the fill head 130.

The through holes 200 are tapered so that the upper width 210 of the through hole 200 is wider than the lower width 230 of the through hole 200. In a preferred embodiment, the lower width 230 is at least 9/10th of the upper width 210. Other dimensions are possible to maintain a volume 290 of the through hole 200.

The volume 290 of the through hole 200 is determined by the thickness 240 of the through hole 200 and the shape of the through hole 200 which can be any three-dimensional shape, e.g. a truncated cone, a truncated pyramid, a trapezoidal box, etc.

FIG. 2B shows a cross section of a single, one-layer decal 105 with through hole openings 200 after completing the IMS step, step B. The through hole openings 200 become filled through hole openings 200F after being filled with solder structures, typically 260, by the fill head 130, forming filled through hole patterns 134.

In a preferred embodiment, the solder structures 260 do not protrude from the top or the bottom of the single, one-layer decal 105. For example, neither the top 261 of the solder structure 260 nor the bottom 262 of the solder structure 260 protrude past the respective top and bottom surfaces of the single, one-layer decal 105. In a preferred embodiment, the entire solder structure 260 remains within the through hole 200F.

In addition, the solder structure 260 is retained within the through hole 200F from the time the solder 131 is injected into the through hole 200 by the fill head 130 in step B until the time the solder structure 260 is pushed onto the substrate 125 at step D. Maintaining the solder structure 260 within the through hole 200 is accomplished by the relative widths of the top 210 and bottom 230 of the through hole 200, the volume 290 of the through hole 200 and a balance between the temperature of the solder 131 while it is injected by the fill head 130 into the through hole 200 and temperature of the solder structure 260 as it leaves the containment of the solder fill plate 130B. The temperature of the solder 131 when being injected into the through holes 200 from the fill head 130 chamber 135 has to be high enough so the solder 131 will homogeneously and uniformly flow into the through holes 200 to form a homogeneous solder structure 260. However, the solder structure 260 must at a temperature cool enough so that when leaving the solder fill plate 130B the solder structure 260 won't flow out of the narrower dimension 230 of the through hole 200.

In preferred embodiments, the solder 131 in the fill head 130 has a temperature just above the melting temperature of solder 131 used when filling the through hole 200 with solder 131. However, the solder 131 in the fill head 130 can have a lower temperature if the solder 131 is under pressure in the fill head while being injected into the through holes 200. In preferred embodiments, the solder 131 can be under a pressure in the range of 0.010 MPa to 0.1000 MPa and the injection temperature of the solder 131 at this pressure can be reduced 5 degrees C. and still melt and flow. The melting point of the solder structure 260 leaving the constraint/pressure of the solder fill plate 130B then increases about 5 degrees C. to that of the melting temperature of solder 131 at atmospheric pressure causing the solder structure 260 to solidify.

In a preferred embodiment, the solder fill plate 130B is a flat plate that remains in contact with the through hole pattern 132 long enough to avoid leaking of any molten solder. In preferred embodiments, the flat plate 130B is unheated and is long enough to maintain contact with and contain the solder until the solder structure a chance to cool to prevent any leaking. In preferred embodiments, the mechanical down pressure of the fill head 130A pushes the solder and film 105 so while the film 105 moves there is wiping of top of solder structure 260 and solder does not flow.

The solder structure 260 leaving the fill head 130 is contained within the filled through hole (200, 200F) until it reaches the substrate 125 at the tangent point 155 at step D because of the design of the through holes 200 and the control of the temperature and pressure during the IMS fill by the fill head 130. As a result, no other apparatus is needed to contain the solder structure 260 in the filled through hole 200F to perform the function of continuously feeding filled through hole patterns 134 to the tangent point 155.

FIG. 2C shows an inspection of each of the solder structures 260 in each of the filled through holes 200F after the IMS step B. The inspection device 140 detects and/or identifies a non-uniformity or defect 270 in one or more of the solder structures 260, e.g., the defect 270 include the solder structure 260 being non-uniform and/or non-homogeneous. In a preferred embodiment, the defective solder structures 260 identified within through hole pattern 134 are not transferred to a substrate 125 at 154. The through hole patterns 134 with defect solder will be cleaned out later for reuse of the decal 105.

FIG. 2D shows a cross section of a single, one-layer decal 105 with filled through hole openings 200F filled with solder structures 260 with the solder structures aligned over one or more recessed pads 245 on a substrate 125. In a preferred embodiment, the recessed pads 245 are recessed a recessed depth 241 below the surface of the substrate 125. The recessed depth to the top of the pad is in the range of 5 to 25 microns below the surface of the substrate 125.

The recessed depth creates a recessed opening 240 above the recessed pad 245. In a preferred embodiment, the single, one-layer decal 105 is pushed in contact with the top surface of the substrate 125 and the filled through holes 200F are aligned above the recessed pads 245 and recessed depth 241 at the tangent point 155 of the drum 150 at step D.

The recessed pad 245 is a metallic material that can be physically bonded to the solder 260. In preferred embodiments, the recessed pad is made of copper, aluminum, nickel, silver, platinum, palladium, gold, or alloys of any of the foregoing. The recessed pad 245 might be part of a conductive line, e.g. a copper line embedded in the substrate 125. If the substrate 125 comprises a semiconductor material or glass, the recessed pad 245 might be a seed layer of metallic material on the semiconductor on which the metallic material and/or solder 260 can bond or a doped portion of the semiconductor.

In a preferred embodiment the bottom 230 of the solder structure does no protrude below the bottom of the single, one-layer decal 105 so the solder structure 260 does not contact the recessed pad 245. Since the bottom 230 of the solder structure 260 is narrower than the top 210 of the solder structure 260, the solder structure 260 cannot be pushed into the recessed opening without adding heat and/or gas pressure. See FIG. 2E and step D in FIG. 1.

In a preferred embodiment, the recessed opening 240 is wider than the bottom width of the solder structure 230 so there is an overhang 241 of the recessed opening 240, typically on both sides (one side numbered as typical) of the solder structure (260, 200F.) The wider recessed opening 240 can accommodate more solder as the solder structure (260, 200F) melts and is pushed, wets the recessed pad 245 surface, and spreads into the recessed opening 240. The recessed opening 240 contains the solder so that it does not flow out of the substrate 125.

The volume 290 of the through holes 200 holds a solder structure 260 with enough volume 290 to cover the recessed pad 245, fill the recessed opening 240 including the overhangs 241, and deposit enough solder 131 to create a re-formed solder structure 280 of desired height after any performed reflows.

FIG. 2E shows the solder structures 260 flowing through the through holes 200 under heating and gas (e.g. air or nitrogen) pressure 154 to fill the recessed opening 240 and make electrical and physical contact and attachment with the recessed pad 245. The solder structures 260 are heated to a temperature above the melting temperature of the solder material with the air pressure being between 0.001 Mpa and 0.100 Mpa. In preferred embodiments, the solder will flow into the recessed opening 240 in about 0.1 second or less. A re-formed solder structure 280 is formed and electrically and physically attached to the substrate 125. In preferred embodiments, the bottom of solder (contacted to the pad) will cool down quickly, but top of the solder is still hot for a while which helps separation from the film 105 more easily.

FIG. 2F shows the removal 281 of the single, one-layer decal 105. In a preferred embodiment, the removal 281 happens as the drum 150 turns and pulls and peels the single, one-layer decal 105 away from the tangent point 155 and away from the substrate 125 as the circumference of the drum 150 moves away from the substrate belt 110. As the single, one-layer decal 105 peels away 281 from the substrate 125 due to the drum 150 turning and pulling one-layer decal 105 from the substrate, the re-formed solder structure 280 remains physically and electrically attached to the metallic recessed pad 245. Since the re-formed solder structure 280 remains on the substrate 125, the through hole 200 becomes an unfilled through hole 200U in an unfilled through hole pattern 132. In a preferred embodiment, the hot molten solder structure 260 wets on a cooler metallic recessed pad 245 because the substrate 125 ranges between room temperature and 100 degrees C. at point D. A cooler substrate 125 will cause the solder to solidify on the metallic recessed pad 245 sooner.

FIG. 2G shows the re-formed solder structure 280 after another reflow which again reforms the solder structure into a solder ball contact 285 with a more rounded contour and defined height 286 on the substrate 125A after the reflow. The final height 286 and shape of the solder ball contact 285 is determined by the volume of the through hole 200, the volume of the recessed opening 240, and the reflows. This completes step E and the addition of solder ball contacts 285 to the initial substrate 125 to become the final substrate 125A. In a preferred embodiment, the height 286 of the solder ball contact 285 is between 5 to 40 microns and the diameter of the solder ball contact 285 is between 10 microns to 300 microns. In a preferred embodiment, solder reflow occurs at peak temperature (maximum temperature) or 20 degrees C. higher than the melting point with a dwell time (time above solder melting temperature) of 90 seconds.

Figure 3:
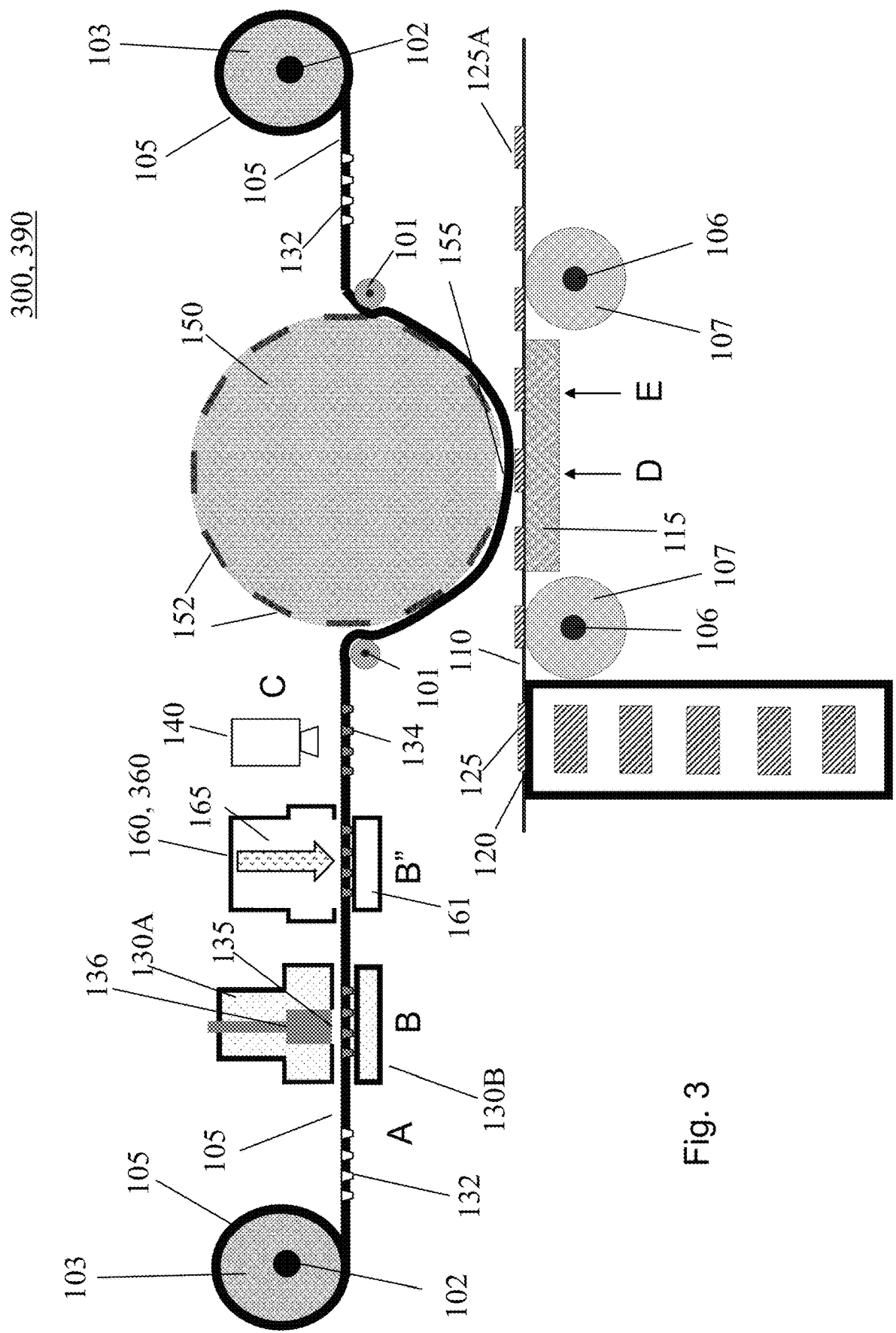
FIG. 3 shows an alternative Injection Molded Solder (IMS) apparatus and a process using a single decal and a protrusion fill head to place solder structures with protrusions and a fine pitch on substrates.

FIG. 3 shows an alternative Injection Molded Solder (IMS) apparatus 300 and a process 390 using a single decal 105 without using a gas pressure step 154 to transfer protruded solder structures with a fine pitch on substrates 125. The apparatus 300 includes a hot gas pressure stage 160 to reform protrusions of the solder structure in the through hole openings 200. In a preferred embodiment, process 390 is performed in a Nitrogen environment.

Again, the same or similar reference numbers used throughout the drawings are used to denote the same or similar features, elements, or structures, and thus, a detailed explanation of the same or similar features, elements, or structures will not be repeated for each of the drawings. Certain elements may be left out of certain views for the sake of clarity and/or simplicity when explanations are not necessarily focused on or would be repetitive for such omitted elements.

In this preferred embodiment, an addition feature 160 is added to the IMS step B to create solder structures 360 with protrusions. Step B can be done after the solder structures 260 are first formed by IMS by the fill head 130 and then reformed by a protrusion fill head 160 or alternatively, the protrusion solder structures 360 can be formed in a single step B by a single protrusion head 360. There is no need for drum openings 152 in the drum 150 in this embodiment because the gas pressure need not be applied at the tangent point 155 in this embodiment.

In preferred embodiments, the protrusion fill head 160 has a solder supply and a solder chamber (not shown) with the addition of a hot gas 165 applied to the solder to partially melt the solder and force it into a formation mold 161. The formation mold 161 has contours that create protrusions on the solder structures 360 that extend below the bottom of the single, one-layer decal 105 as described in more detail below. In other preferred embodiments, the protrusion fill head 160 only provides hot gas and/or heat from the formation mold 161 to melt the solder (260, 360) in the through holes 200F while the solder 260 (260, 360) is reformed to add one or more protrusions.

Figure 4A:
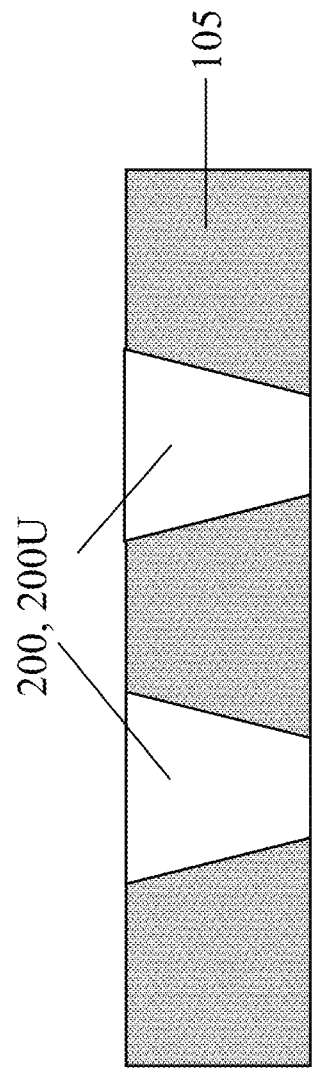
FIG. 4A shows a cross section of a single, one-layer decal with through hole openings.

FIG. 4A shows a cross section of a single, one-layer decal 105 with unfilled through hole openings (200, 200U.)

Figure 4B:
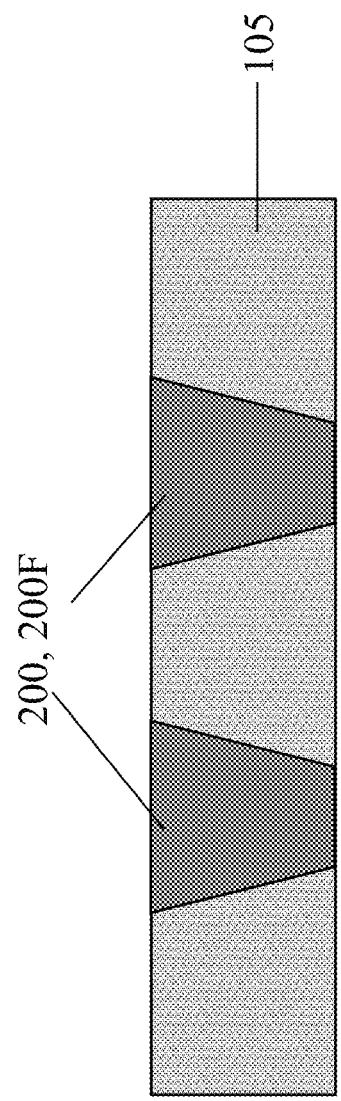
FIG. 4B shows a cross section of a single, one-layer decal with through hole openings filled with solder.
Figure 4:
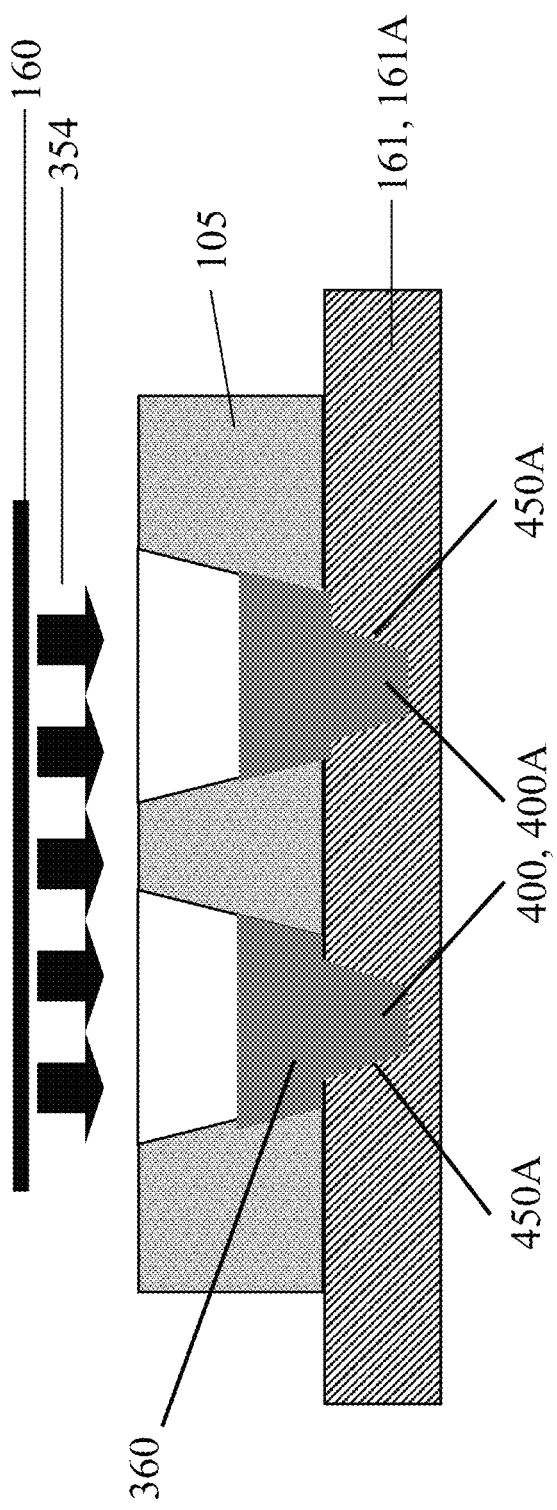
FIG. 4C shows using a protrusion fill head applying heat and gas pressure to create protrusion solder structures with protrusions protruding from the through holes in the single, one-layer decal.
FIG. 4D shows the in-decal protrusion solder structures with one preferred shaped protrusion.
FIG. 4E shows a cross section of a single, one-layer decal with through hole openings filled with protrusion solder structures with one preferred shape protruding from the through holes with the protrusion aligned over one or more recessed pads on a substrate.
FIG. 4F shows solder structures reflowing onto the recess pads on a substrate.
FIG. 4G shows removal of the single, one-layer decal.
FIG. 4H shows the solder ball contacts on the substrate after another reflow.
Figure 4:
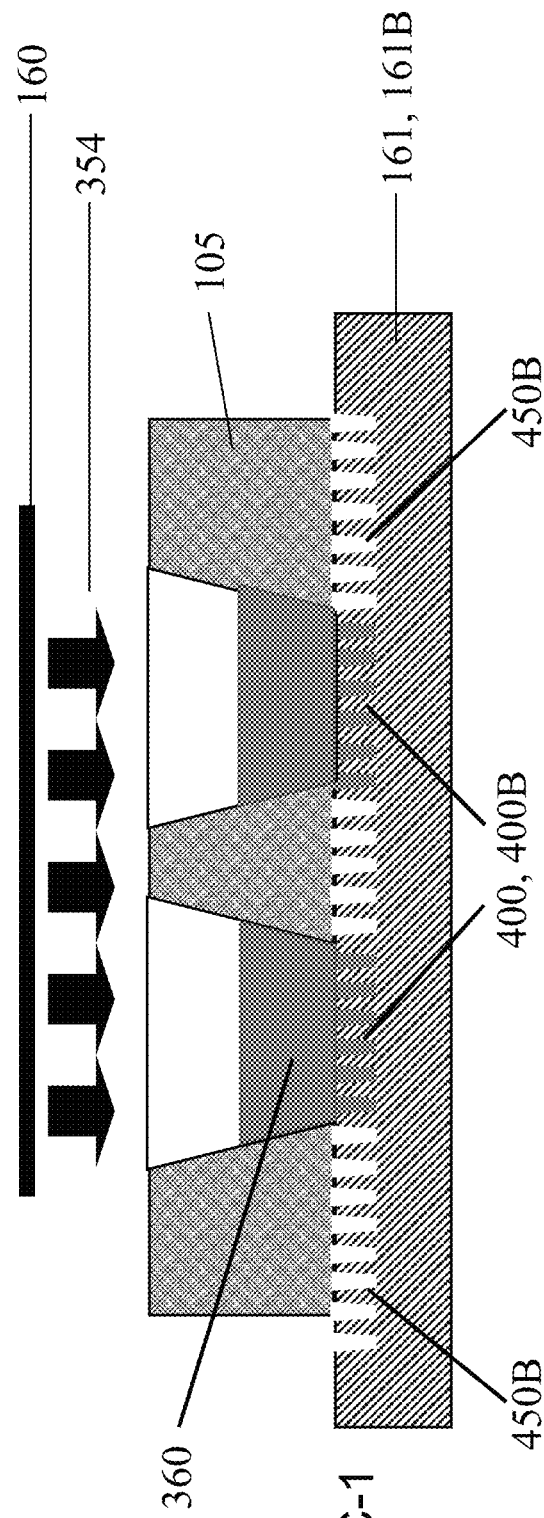

FIG. 4B shows a cross section of a single, one-layer decal 105 with filled through hole openings (200, 200F) filled with solder 200F by the IMS. In embodiments with a single protrusion fill head 160, this step is combined with the step in FIG. 4C.

FIG. 4C shows using a protrusion fill head 160 and a formation mold 161 while applying heat and gas pressure 354 to create a shaped protrusion 400 on the bottom of the solder structures 360. The protrusion 400 protrudes from and past the through holes 200 in the single, one-layer decal 105. In preferred embodiments, the protrusions 400 of the solder structures 360 are wider at the top than at the bottom so that the formation mold 161 can be more easily removed from the solder structure 360. In addition, the formation mold 161 has an opening in the protrusion pattern 450A narrower than the bottom through hole opening to help retain solder 131 in the through hole 200F while the protrusion 400 is formed in the protrusion pattern 450A. In preferred embodiments the solder 360 including the protrusion 400 is held in place until the solder 360 is cool therefore remains in the filled through hole 200F. In alternative embodiments, the temperature of the solder 360 is maintained below the melting temperature of solder material so the solder does not freely flow without the applied gas pressure 354. The applied gas 354 temperature is above the melting temperature of the older solder material 360 and, in a preferred embodiment, the gas pressure 354 is in the range of 0.001 MPa to 0.1000 MPa. The solder 360 will melt within about 0.1 second once the heat is applied.

FIG. 4C shows one embodiment of a formation mold 161 with a mold pattern 161A with a single protrusion pattern 450A. This embodiment of protrusion pattern 450A is wider toward the one-layer decal 105 and narrows as the protrusion 400 is down and away from the decal 105. This tapered pattern 450A creates a protrusion 400A that is easier to remove from the formation mold (161, 161A.)

In one embodiment, the solder structure 260 is initial formed by fill head 130 without the protrusion 400. Then the solder structure 260 is re-formed by applying heat and gas pressure in the protrusion fill head 160 to force the solder structure 260 into the formation mold 161 with protrusion pattern 450A to create the solder structure 360 with protrusion 400.

In an alternative embodiment, there is no fill head 130 and the solder structure 360 is formed with protrusion 400 in one step C by the protrusion fill head 160 alone.

FIG. 4C-1 shows using a formation mold 161 with an alternative pattern 161B and application of heat and gas pressure 354 to create an alternative shaped protrusion 400B on the bottom of the solder structures 360 protruding from through holes 200 in the single, one-layer decal 105. In this embodiment, the cavity diameter and pitch of blind cavity pattern 161B in layer 161 is typically between ½ to ¹⁄₁₀ that of corresponding dimensions of embodiment in FIG. 4C and covers the entire active (solder receiving) area of the formation mold. Due to these smaller pitches (distance between hole centers) and total area coverage, there is no alignment needed between decal layer 105 and formation mold 161, since some cavities 400 will always fall within the larger solder structures 360 of decal layer 105.

The protrusions 400B in this embodiment are a plurality of smaller protrusions 400B for each solder structure 360 that are also tapered so the protrusions are wider at their top than their bottom to ease the extraction of the formation mold 161B and protrusion pattern 450B. Protrusions of this shape 400B are likely to melt faster because they have more exposed surface area for heat transfer.

Multiple variations of protrusion shapes 400 are envisioned.

The formation mold 161 is removed after the formation of the protrusions 400. At this point, the application of heat and gas pressure 354 stops.

FIG. 4D shows the in-decal solder structures 360 with one preferred shaped protrusion 400A after the formation mold 161 is removed. Because of the shape of the solder structure 360 and the conditions under which the solder structure 360 was formed, the solder structure 360 remains in the through hole 200 without need for additional support, e.g. another decal, throughout the movement through the apparatus 300 from the inspection 140 until the final substrate 125A is formed.

FIG. 4D-1 shows the in-decal solder structures 360 with an alternative preferred shaped protrusion 400B after the formation mold 161 is removed. Because of the shape of the solder structure 360 and the conditions under which the protrusion solder structure 360 was formed, the protrusion solder structure 360 remains in the through hole 200 without need for additional support, e.g. another decal, throughout the movement through the apparatus 300 from the inspection 140 until the final substrate 125A is formed.

FIG. 4E shows a cross section of a single, one-layer decal 105 with through hole openings 200 filled with solder structures 360 with one preferred shape protruding 400A from the through holes 200 and with the protrusion 400A aligned over and touching the recessed pad 245 on a substrate 125. This positioning of the shown components occurs at the tangent point 155 of the drum 150.

At this point in the process 390, the drum 150 maintains pressure on the single, one-layer decal 105 and the protrusion solder structure 360 so that the protrusion 400A is in physical contact with the metallic recessed pad 245. Because the protrusion solder structure 360 is in physical contact with the recessed pad 245 a smaller amount of heat will cause the protrusion 400A to melt and wet the surface of the recessed pad 245 which then cause the remainder of the protrusion solder structure 360 to melt and fill the recessed opening 240 and re-form the protrusion solder structure 360 into a re-formed solder structure 280. The need to apply air pressure is therefore eliminated in order to flow the protrusion solder structure 360 into the recessed opening 240.

In a preferred embodiment, the drum 150 temperature is above melting temperature of the solder material and helps melt the solder 360 when reaching the tangent point 155. After the hot molten solders touches the cold metallic recessed pads 245, the solder wets the surface of the pad 245 within 0.1 second. In a preferred embodiment, the substrate 125 is in a temperature range between room temperature and 100 degrees C. depended on the solder material used. In some environments, flux is applied to help solder wetting on the pads.

FIG. 4E-1 shows a cross section of a single, one-layer decal 105 with through hole openings 200 filled with alternative protrusion solder structures 360 having an alternative protrusion 400B the through holes 200. As with the structure in FIG. 4E, the protrusion 400B is aligned over and is in contact the recessed pad 245 so that the protrusion 400B melts and wets the recessed pad 245 and then flow to form a re-formed solder structure 280.

In a preferred embodiment, the substrate pressure plate 115 is a controlled heat plate 115 that provides the heat needed at the time the protrusion solder structure 360 is pressured so the protrusion 400 contacts the recessed pad 245.

FIG. 4F shows re-formed solder structures 280 that are in physical, structural, and electrical contact with the recessed pad 245 after the protrusion solder structure 360 is heated to melt and wet the recessed pad 245 and then continue to reflow to fill the recessed opening 240 and re-form into a shape 280 removable from the through hole 200.

Figure 4G:
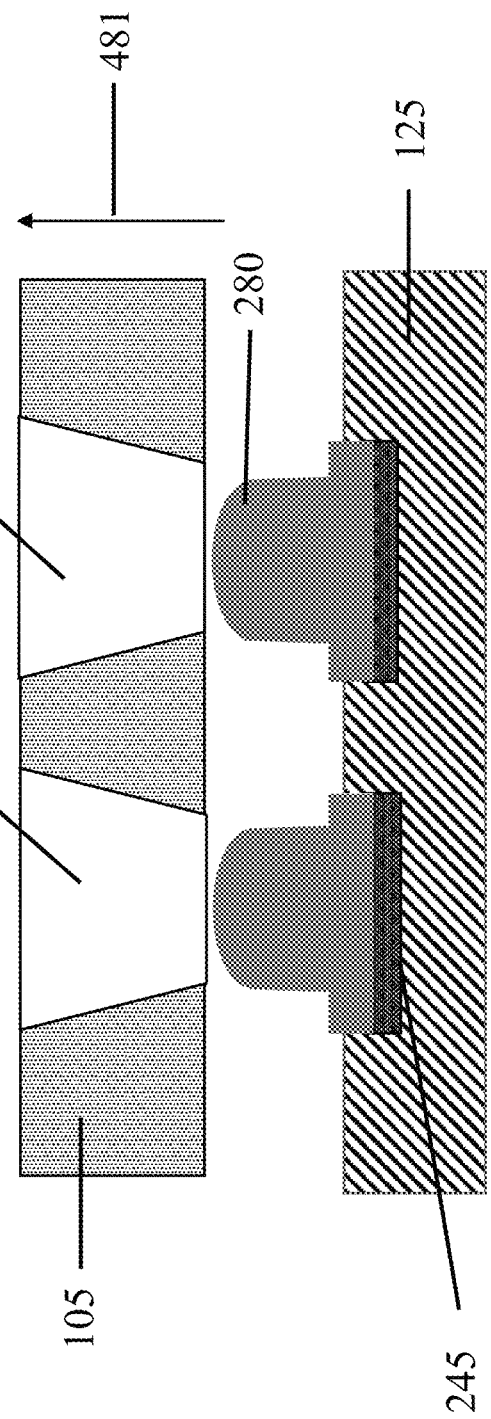

FIG. 4G shows removal 481 of the single, one-layer decal 105, the beginning of step E.

In a preferred embodiment, the removal 281 happens as the drum 150 turns and pulls and peels away the single, one-layer decal 105 away from the tangent point 155 and away from the substrate 125. As the single, one-layer decal 105 moves away 281 from the substrate 125, the re-formed solder structure 280 remains physically, structurally, and electrically attached to the metallic recessed pad 245. As a result of the re-formed solder structure 280 remaining on the substrate 125, the through hole 200 becomes an unfilled through hole 200U in an unfilled through hole pattern 132. After the run is completed the one-layer decal 105 can be cleaned and reused.

Figure 4H:
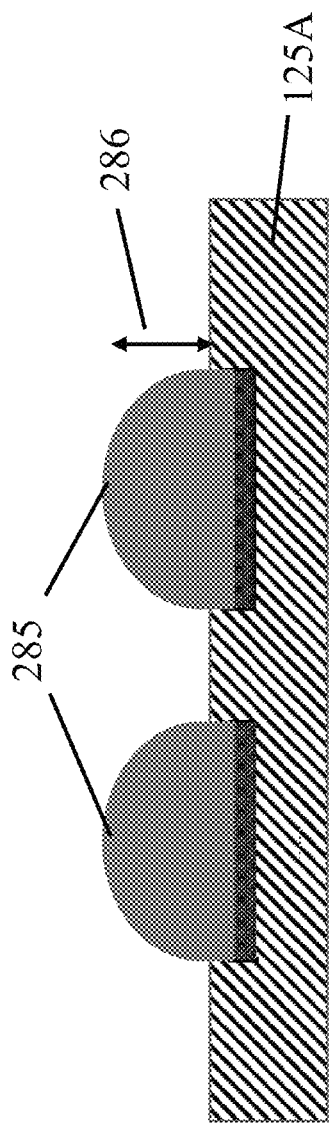

FIG. 4H shows the re-formed solder structure 280 after another reflow which again reforms the solder structure 280 into a solder ball contact 285 with a more rounded contour and defined height 286 on the substrate 125A after another reflow. As explained above, the final height 286 and shape of the solder ball contact 285 is determined by the volume of the through hole 200, the volume of the recessed opening 240, and the reflows. This completes step E and the addition of solder ball contacts 285 to the substrate 125 to the final substrate 125A.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An injection molded solder system comprising:
    a decal with one or more through hole patterns, each through hole pattern having a plurality of through holes through the decal, the decal capable of being driven in a decal direction, the through holes having a through hole top with a top width and a through hole bottom with a bottom width, the top width being wider than the bottom width;
    a substrate belt capable of holding a plurality of substrates, the substrate belt driven in a belt direction;
    a fill head capable of injecting the through holes with solder as the through hole pattern is driven past a protrusion fill head causing a solder structure to form within each of one or more of the through holes; and
    a drum with a drum circumference, the decal forced to be adjacent to the drum circumference and the drum circumference and decal turning and passing a tangent point,
    wherein as each of the solder structures are aligned with a recessed opening on a substrate at the tangent point heat causes the solder structures to melt and flow into the recessed opening.

2. A system, as in claim 1, where the heat is provided by any one or more of the following: hot gas from an opening in the drum at the tangent point, the drum circumference temperature, and a heated pressure plate that holds the substrate and decal against the drum circumference at the tangent point.

3. A system, as in claim 2, where the heated pressure plate is heated in one or more of the following ways: continuously and intermittently each time the substrate was at the tangent point.

4. A system, as in claim 1, further comprising an inspection device, the inspection device inspecting one or more of the through holes filled with solder to determine if the solder in the through hole was defective.

5. A system, as in claim 4, where the solder was defective because the solder was not homogeneous.

6. A system, as in claim 4, where the inspection device further determines if one or more of the through holes filled with solder was aligned with one or more of the recessed openings respectively before the substrate reaches the tangent point.

7. A system, as in claim 4, where substrates associated with defective filled through holes are removed from the system.

8. A system, as in claim 1, where the heat is caused by a hot gas that is under pressure in the range of 0.010 MPa to 0.1000 MPa.

9. A system, as in claim 8, where the pressure lowers the melting point of the solder at least 5 degrees Celsius.

10. A system, as in claim 1, where there is only a single decal and the single decal has only one-layer.

11. A system, as in claim 1, where the through holes in the decal are tapered to maintain the solder structures within the through holes while the solder structures were solid.

12. An injection molded solder system comprising:
    a decal with one or more through hole patterns, each through hole pattern having a plurality of through holes through the decal, the decal capable of being driven in a decal direction, the through holes having a through hole top with a top width and a through hole bottom with a bottom width, the top width being wider than the bottom width;
    a substrate belt capable of holding a plurality of substrates, the substrate belt driven in a belt direction;
    a protrusion fill head injecting the through holes with solder as the through hole pattern is driven past the protrusion fill head causing a protrusion solder structure to form within each of one or more of the through holes, the protrusion solder structure having one or more protrusions passing through the through holes; and
    a drum with a drum circumference, the decal forced to be adjacent to the drum circumference and the drum circumference and turning and passing a tangent point,
    wherein heat is applied to the protrusion solder structures when aligned with a recessed opening on a substrate at the tangent point causing the protrusion solder structure to flow into the recessed opening.

13. A system, as in claim 12, where the protrusions are in one or more of the following shapes: a single protrusion per recessed opening, a single tapered protrusion per recessed opening, a plurality of protrusions per recessed opening, and a plurality of tapered protrusions per recessed opening.

14. A system, as in claim 12, where the protrusions are long enough to contact a metal recessed pad within the recessed opening to reduce the amount of heat needed to cause the protrusion solder structure to flow.

15. A system, as in claim 12, where the heat is provided from the contact with the drum at the tangent point, the drum being at a temperature above the melting point of the protrusion solder structure.

16. A method of attaching a solder ball to a substrate, comprising the steps of:
    injecting a solder structure into a through hole, the through hole being one of a pattern of through holes in one or more through hole patterns on a decal;
    moving the decal around the circumference of a drum;
    moving one or more of the substrates on a substrate belt, each substrate having one or more recessed openings with a metal recessed pad at the bottom of the recessed opening;
    aligning one or more of the solder structures with one or more of recessed openings, respectively, at a tangent point on the circumference of the drum;
    applying heat at the alignment at the tangent point to melt the solder structure and cause the solder structure to flow into the recessed opening.

17. A method, as in claim 16, further comprising the step of:
    removing the decal from the solder structure attached to the substrate; and reforming the solder structure into a solder ball by applying heat to cause another re-flow.

18. A method, as in claim 16, the heat is applied at the alignment at the tangent point by a hot gas flowing through a drum opening in the drum circumference, the drum opening also in alignment at the tangent point.

19. A method, as in claim 16, the drum is applying heat and pressure at the alignment at the tangent point to melt the solder structure and cause the solder structure to flow into the recessed opening.

20. A method, as in claim 16, where the solder structure has one or more protrusion contacting the metal recessed pad in alignment at a tangent point.

* * * * *